(12) United States Patent
Ostman

(10) Patent No.: US 11,212,967 B2
(45) Date of Patent: Jan. 4, 2022

(54) LIGHT EMITTING STRUCTURES

(71) Applicant: HGCI, Inc., Las Vegas, NV (US)

(72) Inventor: Charles Hugo Ostman, Sebastopol, CA (US)

(73) Assignee: HGCI, Inc., Las Vegas, NV (US)

( * ) Notice: Subject to any disclaimer, the term of this patent is extended or adjusted under 35 U.S.C. 154(b) by 173 days.

(21) Appl. No.: 16/478,898

(22) PCT Filed: Jan. 19, 2018

(86) PCT No.: PCT/US2018/014450
§ 371 (c)(1),
(2) Date: Jul. 18, 2019

(87) PCT Pub. No.: WO2018/136755
PCT Pub. Date: Jul. 26, 2018

(65) Prior Publication Data
US 2019/0327907 A1 Oct. 31, 2019

Related U.S. Application Data

(60) Provisional application No. 62/448,951, filed on Jan. 20, 2017.

(51) Int. Cl.
*A01G 7/04* (2006.01)
*F21V 23/00* (2015.01)
(Continued)

(52) U.S. Cl.
CPC ............... *A01G 7/045* (2013.01); *A01G 9/12* (2013.01); *F21V 23/003* (2013.01);
(Continued)

(58) Field of Classification Search
CPC .......... A01G 7/045; A01G 9/12; A01G 31/06; H05B 45/00; F21V 23/003; F21V 21/00;
(Continued)

(56) References Cited

U.S. PATENT DOCUMENTS 4,163,342 A 8/1979 Fogg et al.
4,255,897 A 3/1981 Ruthner
(Continued)

FOREIGN PATENT DOCUMENTS

CN 101133707 A 3/2008
KR 1020120118691 A 10/2012
(Continued)

OTHER PUBLICATIONS

Extended European Search Report for European Application No. 18742218.3, dated Sep. 9, 2020, 10 pages.
(Continued)

*Primary Examiner* — Bao Q Truong
(74) *Attorney, Agent, or Firm* — Ulmer & Berne LLP

(57) ABSTRACT

A light emitting structure includes a plurality of structural members forming a framework, wherein the framework has a plurality of spaces between the plurality of structural members; a lighting circuit integrally connected to one or more of the plurality of structural members; and a plurality of light emitting diodes electrically connected to the lighting circuit, wherein the plurality of light emitting diodes are integrally connected to the plurality of structural members via the lighting circuit; wherein the plurality of structural members are constructed to support one or more plants.

18 Claims, 11 Drawing Sheets

(51) Int. Cl.
  *A01G 9/12* (2006.01)
  *H01L 25/075* (2006.01)
  *H05B 45/00* (2020.01)
  *F21Y 103/30* (2016.01)
  *F21Y 107/40* (2016.01)
  *F21Y 115/10* (2016.01)
  *F21Y 103/20* (2016.01)
  *A01G 31/06* (2006.01)

(52) U.S. Cl.
  CPC ......... *H01L 25/0753* (2013.01); *H05B 45/00* (2020.01); *A01G 31/06* (2013.01); *F21Y 2103/20* (2016.08); *F21Y 2103/30* (2016.08); *F21Y 2107/40* (2016.08); *F21Y 2115/10* (2016.08)

(58) Field of Classification Search
  CPC .... F21V 21/005; F21V 23/004; F21V 23/005; H01L 25/0753; F21Y 2103/30; F21Y 2107/40; F21Y 2115/10; F21Y 2103/20
  See application file for complete search history.

(56) References Cited

U.S. PATENT DOCUMENTS

| | | | |
|---|---|---|---|
| 4,349,864 | A | 9/1982 | Smith |
| 4,845,602 | A | 7/1989 | Lehocki |
| 6,105,309 | A | 8/2000 | Takayanagi |
| 6,312,139 | B1 | 11/2001 | Baker et al. |
| 6,921,182 | B2 | 7/2005 | Anderson, Jr. et al. |
| 7,033,060 | B2 | 4/2006 | Dubuc |
| 7,038,593 | B2 | 5/2006 | Pederson |
| 7,905,052 | B2 | 3/2011 | Hurst et al. |
| 8,151,517 | B2 | 4/2012 | Emoto |
| 8,297,782 | B2 | 10/2012 | Bafetti et al. |
| 8,604,700 | B2 | 12/2013 | Waumans et al. |
| 8,826,589 | B2 | 9/2014 | Goeschl |
| 9,010,022 | B2 | 4/2015 | Brusatore |
| 9,030,089 | B2 | 5/2015 | Komada et al. |
| 9,357,718 | B1 | 6/2016 | Lehman et al. |
| 9,485,919 | B2 | 11/2016 | Takeuchi |
| 9,538,615 | B1 | 1/2017 | Armstrong |
| 2003/0162288 | A1 | 8/2003 | Everett |
| 2004/0163308 | A1 | 8/2004 | Uchiyama |
| 2005/0005529 | A1 | 1/2005 | Brault et al. |
| 2005/0102894 | A1 | 5/2005 | Jocelyn |
| 2006/0006820 | A1 | 1/2006 | Roseman et al. |
| 2010/0031564 | A1* | 2/2010 | Loebl ...................... A01G 9/16 47/39 |
| 2010/0107489 | A1 | 5/2010 | Silver |
| 2010/0117537 | A1 | 5/2010 | Horppu et al. |
| 2011/0115385 | A1 | 5/2011 | Waumans et al. |
| 2011/0214344 | A1 | 9/2011 | Kahn |
| 2012/0124903 | A1 | 5/2012 | Takeuchi |
| 2013/0255146 | A1 | 10/2013 | Lehman et al. |
| 2013/0283683 | A1 | 10/2013 | Ringbom et al. |
| 2014/0000162 | A1 | 1/2014 | Blank |
| 2014/0123555 | A1 | 5/2014 | McCord et al. |
| 2015/0069442 | A1 | 3/2015 | Liu et al. |
| 2015/0116997 | A1 | 4/2015 | Tappert et al. |
| 2015/0128488 | A1 | 5/2015 | Casper et al. |
| 2015/0181811 | A1 | 7/2015 | Krijn et al. |
| 2015/0223402 | A1 | 8/2015 | Krijn et al. |
| 2015/0230409 | A1 | 8/2015 | Nicole et al. |
| 2015/0272015 | A1 | 10/2015 | Sowinski |
| 2016/0000018 | A1 | 1/2016 | Van Elmpt et al. |
| 2018/0007845 | A1 | 1/2018 | Martin |
| 2018/0014487 | A1* | 1/2018 | Tinsley .................. A01G 31/06 |
| 2018/0163929 | A1* | 6/2018 | Jang .......................... F21K 9/27 |

FOREIGN PATENT DOCUMENTS

| | | |
|---|---|---|
| SU | 570343 A1 | 8/1977 |
| WO | 2016147195 A1 | 9/2016 |

OTHER PUBLICATIONS

International Search Report and Written Opinion of the International Searching Authority for Application No. PCT/US2018/014450 dated Jun. 1, 2018 (12 pages).
Netled Oy Ltd., "Netled OptoGrowia Interlight," May 2010, 1 page.
Kessil, "Booster LEDs Take Plant Steering to a Whole New Level," retrieved from http://web.archive.org/web/20150922042633/http://www.kessil.com/horticulture/publications_201101.php, Jan. 2011, 6 pages.
Ballaré et al., "Canopy Light and Plant Health," Plant Physiology, Sep. 2012, vol. 160, pp. 145-155.
Goodman, "LED Grow Lights—FertiLight Halo Rings (from elementalled.com)," [online], YouTube, retrieved from https://www.youtube.com/watch?v=4cx8fw3asRI, available Apr. 19, 2012, 5 pages, Duration 4:26.
Koninklijke Philips Electronics N.V., "There's more to light, Philips GreenPower LED interlighting module UL/CSA," Jan. 2013, 12 pages.
Koninklijke Philips N.V., "Light between the plants, Helping your business to blossom," Jul. 2015, 12 pages.
Nickleson, "Everything You Need to Know About Indoor Gardening," retrieved from http://web.archive.org/web/20161210161226/http://www.towergarden.com/blog.read.html/en/2015/2/see_how_easily_youc.html, Feb. 27, 2015, 10 pages.
Scrogger, "P SCROG Primary System," retrieved from http://web.archive.org/web/20161031122343/https://scrogger.com/products/p-scrog-primary-system, Oct. 31, 2016, 2 pages.

* cited by examiner

END VIEW

SIDE VIEW

LIGHT EMITTING STRUCTURES

REFERENCE TO RELATED APPLICATIONS

This application claims the priority benefit of U.S. Provisional Patent Application No. 62/448,951, filed on Jan. 20, 2017, the disclosure of which is hereby incorporated herein by reference.

DETAILED DESCRIPTION

The following text sets forth a broad description of numerous different embodiments. The description is to be construed as exemplary only and does not describe every possible embodiment since describing every possible embodiment would be impractical, if not impossible, and it will be understood that any feature, characteristic, component, composition, ingredient, product, step or methodology described herein can be deleted, combined with or substituted for, in whole or part, any other feature, characteristic, component, composition, ingredient, product, step or methodology described herein. Numerous alternative embodiments could be implemented, using either current technology or technology developed after the filing date of this patent, which would still fall within the scope of the claims.

It should also be understood that, unless a term is expressly defined in this specification using the sentence "As used herein, the term '_____' is hereby defined to mean . . ." or a similar sentence, there is no intent to limit the meaning of that term, either expressly or by implication, beyond its plain or ordinary meaning, and such term should not be interpreted to be limited in scope based on any statement made in any section of this patent (other than the language of the claims). No term is intended to be essential unless so stated. To the extent that any term recited in the claims at the end of this patent is referred to in this patent in a manner consistent with a single meaning, that is done for sake of clarity only so as to not confuse the reader, and it is not intended that such a claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. § 112, sixth paragraph.

Figure 1A:
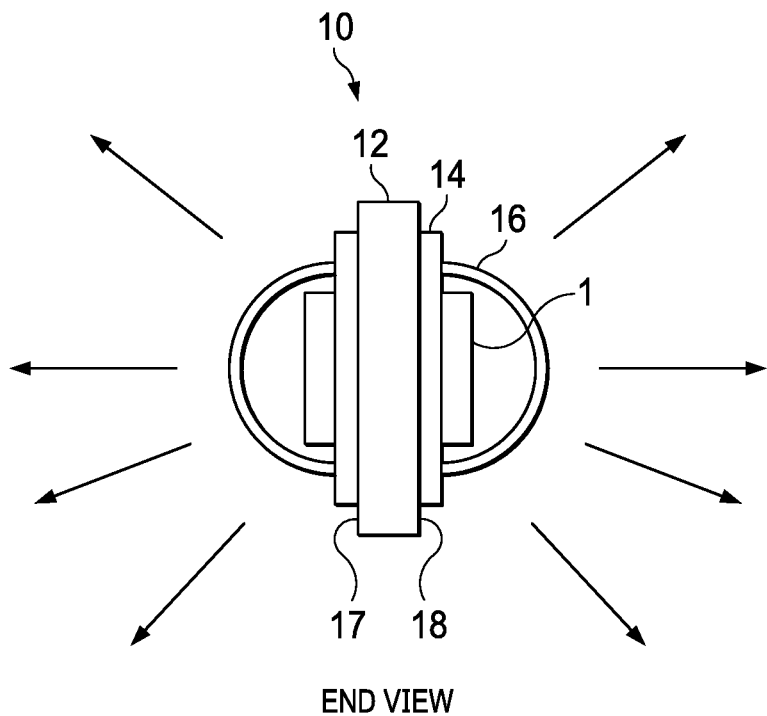
FIG. 1A is end view of a light emitting structural member according to one or more embodiments.
Figure 1B:
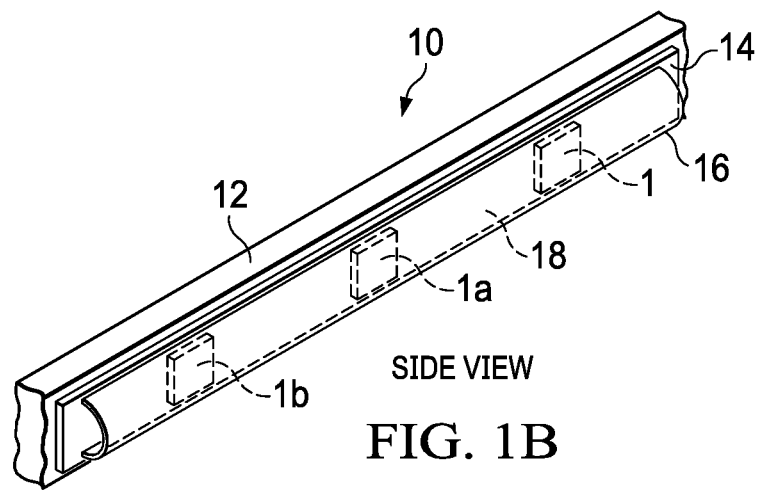
FIG. 1B is an isometric view of the light emitting structural member of FIG. 1.

Referring to FIGS. 1A and 1B, an embodiment of a light emitting structural member 10 is shown. The illustrative light emitting structural member 10 is constructed to be used as part of one or more of the light emitting structures shown and disclosed herein. The light emitting structural member 10 may be fabricated from an aluminum extrusion bar stock 12. The bar stock may be solid, hollow, or some combination thereof. The member 10 may include a linear multi-conductor printed circuit laminate 14 that is disposed on one or more outer surfaces of the bar stock 12. The member 10 may be fabricated from other materials, including but not limited to metals, plastics, composites, other various materials, and/or combinations thereof.

In one or more of the embodiments shown and described herein, the light emitting structural member 10 may include a lighting circuit (e.g., conductors) and one or more LEDs electrically connected to the lighting circuit such that the LEDs and light circuit are integral to the light emitting structural member 10. "Integral," as used herein means that two or more parts so described are affixed, fastened or joined together so as to move or function together as a substantially unitary part. "Integral" includes, but is not limited to, parts that are continuous in the sense that they are formed from the same continuous material, but also includes discontinuous parts that are joined, fastened or affixed together by any means so as become substantially immovably affixed to, and substantially unitary with, each other. "Integral" does not include two or more parts that are detachably connected such that the two or more parts may be separated from each other without damaging the detachably connected two or more parts.

As shown in FIGS. 1A and 1B, the member 10 includes a first and second printed circuit laminate 14 on respective first and second outer surfaces 17, 18 of opposite sides of the bar stock 12. The structural member 10 may include a plurality of light emitting diodes (LEDs) 1 (e.g., first LED 1A, second LED 1B, etc.) such as, for example, a linear array of LEDs 1, that are electrically connected to the printed circuit laminate 14. The LEDs 1 may comprise any type of LED known or yet-to-be developed. As an example, the LEDs 1 may include, but not be limited to SMD5050, SMD5630, SMD3528 type, or other similar variants. The LEDs 1 may comprise one or more colors such as, for example, red (e.g., wavelengths of about 650 nm), far red (e.g., wavelengths of about 710 nm to about 850 nm) blue (e.g., wavelengths of about 440 nm), UV and near-UV (e.g., wavelengths of about 370 nm to 400 nm or about 390 nm), etc., as will be further described below herein. In some embodiments, all the LEDs may be a single color such as, for example, blue. In some embodiments the LEDs may be two or more colors interspersed along the array such as, for example, blue, UV, and/or red LEDs interspersed along the linear printed circuit laminate 14 and thus the light emitting structural member 10. The LEDs 1 and/or the array of LEDs may comprise any combination of color wavelengths and/or configurations.

In some embodiments, the light conductors and/or circuit may comprise aluminum, copper, other conductive materials, or combinations thereof that then have a protective sheath or coating. The illustrative configuration shown in FIGS. 1A and 1B enables light to radiate outwardly from both sides of the structural member 10 such as, for example, radiate at 120 degrees angle of divergence or greater. It is understood that the structural member 10 configuration and/or the LED 1 configuration may be manipulated to change the angle of divergence that the light radiates from the member 10.

The conductors and/or circuit may be flexible, semi-rigid, or rigid. In some embodiments, the materials used to fabricate the member 10 (e.g., aluminum bar stock 12) may be chosen and/or fabricated to function as a heat sink to provide improved electrical and photonic performance of the LEDs 1.

The structural member 10 may also include a layer of optically transmissive silicone sealant 16 or similar material to encapsulate and/or provide water proofing protection of the printed circuit laminates 14 and the LEDs 1 (e.g., the linear array of LEDs). The entire light assembly (e.g., printed circuit laminate 14, LEDs 1, and/or silicone sealant 16) may be laminated onto one or more of the surfaces of the member 10 (e.g., first surface 17 and second surface 18), making the LEDs 1 and lighting circuit (or lighting assembly) integral to the member 10. Any various adhesives and/or coatings may be used to laminate, connect, and/or attach the assembly to the structural member 10. In some embodiments, the lighting circuit and LEDs 1 may include various other types of connectors and/or connecting methods to integrally connect the lighting circuit and LEDs 1 to the structural member 10 such as, for example, welds, snap-fit connections, bolt connections, screw connections, tongue and groove connections, tab and slot connections, any other known or yet-to-be developed connectors, and/or combinations thereof.

In some embodiments, the lighting circuit such as, for example, the first and/or second printed circuit laminates 14 or conductors, may be disposed within a hollow interior of the structural member 10 such as, for example, the bar stock 12. In such embodiments, the member 10 (e.g., the bar stock 12) may include a plurality of apertures that are constructed to receive the LEDs 1, enabling the LEDs 1 to be connected to the circuit within the interior of the structural member 10 and then protrude through to emit light from an exterior of the structural member 10.

Figure 2:
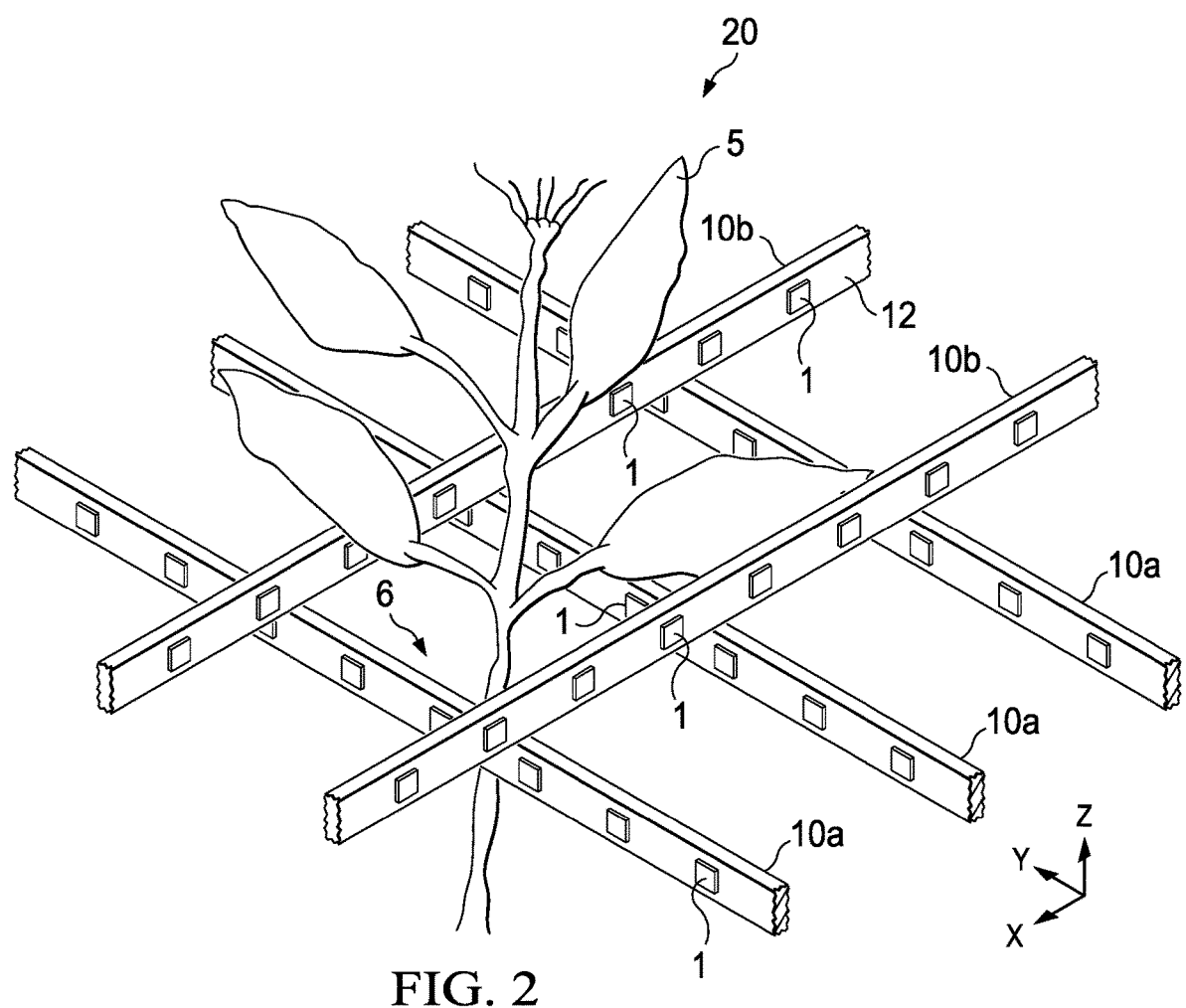
FIG. 2 is an isometric view of a light emitting structure according to one or more embodiments.

Referring to FIG. 2, a light emitting structure 20 is shown, including a plurality of the light emitting structural members 10 (e.g., light emitting structural member 10a and light emitting structural member 10b) constructed to form an array, matrix or lattice. For example, the light emitting structure 20 includes a plurality of light emitting structural members 10a disposed horizontally (or substantially horizontally) parallel (or substantially parallel) to the Y-axis and a plurality of light emitting structural members 10b disposed horizontally (or substantially horizontally) parallel (or substantially parallel) to the X-axis to form a plurality of spaces 6 disposed between the light emitting structural members 10a and 10b. In the embodiment shown, the structural members 10a may be positioned at a 90 degree angle (transverse) to the structural members 10b.

Each of the plurality of light emitting structural members 10a may be spaced apart from each other an equidistance or varied distance. Similarly, each of the plurality of light emitting structural members 10b may be spaced apart from each other an equidistance or varied distance. As shown, the light emitting structural members 10b may be positioned upon the light emitting structural members 10a or vice versa. In other embodiments, the light emitting structural members 10b may be connected to one or more of the light emitting structural members 10a, or vice versa, using any of a variety of connectors or connection methods, including but not limited to welds, snap-fit connections, bolt connections, screw connections, tongue and groove connections, tab and slot connections, any other known or yet-to-be developed connectors, and/or combinations thereof. In some embodiments, the light emitting structural members 10a and 10b are detachably connected to enable the disassembly of such members in order to harvest one or more plants (e.g., plant 5) (which may include the removal of the one or more plants). In some embodiments, such disassembly may be accomplished in such a way that it minimize or mitigates damage (possibly eliminating damage) to the one or more plants that are growing up through one or more of the spaces 6 during harvesting.

In some embodiments, the light emitting structure 20 may comprise multiple layers or levels of the array of light emitting structural members 10a and 10b along the Z-axis to form a lattice or scaffolding structure or assembly. In some embodiments, the light emitting structure 20 having one or more levels of arrays of the light emitting members 10a and 10b may be either suspended from an overhead support structure (e.g., ceiling or overhead framework) via rods, bars, wire, rope, string, combinations thereof, and/or other various hangers, or include one or more legs (not shown) that extend downwardly from at least one of the arrays of the light emitting members 10a and 10b to support the light emitting structure 20. In some embodiments, in between each adjacent level of the array of the light emitting structural members 10a and 10b are disposed one or more vertical frame members (not shown) that may connect each level to each adjacent level. In embodiments, when the light emitting structure 20 is suspended from an overhead support structure, then the one or more vertical frame members may be rigid, semi-rigid, or flexible and may comprise rods, bars, wire, rope, string, combinations thereof, and/or other various hangers. In such embodiments, the legs may be removed or not included. In embodiments, when the light emitting structure is supported upon the ground via one or more legs, then the one or more vertical frame members may be rigid or semi-rigid, including but not limited to rods, bars, bar stock. A distal end of each leg may rest upon a surface (e.g., ground, floor, etc.) or be connected to a pot, planter, and/or hydroponic unit/planter. Whether suspended from the ceiling or supported upon a surface, the light emitting structure 20 is positioned above the ground, soil, pot, planter, and/or hydroponic unit/planter such that one or more plants may grow up through the one or more of the spaces 6.

In some embodiments, the vertical frame members may be fixedly or detachably connected to the adjacent array of light emitting structural members 10a and 10b. The vertical frame members may use any of the connectors and/or connection methods as set forth herein to connect to the adjacent array of light emitting structural members 10a and 10b. In some embodiments, the vertical frame members may also include one or more of the assemblies of the plurality of LEDs 1, printed circuit laminates 14, and silicone sealant 16 as described herein on one or more of the surfaces of the vertical frame members.

As shown, the light emitting structure 20 may be positioned such that one or more plants (e.g., a plant 5) may grow into and up through one or more of the spaces 6 such that light emitting structure 20 may introduce and/or direct light from a variety of angles and sides and, in some cases, at close proximities (e.g., about 0 mm to about 500 mm, or about 0 mm to about 250 mm, or about 0 mm to about 150 mm, or about 0 mm to about 75 mm, or about 0 mm to about 50 mm, or about 0 mm to about 25 mm, or about 0 mm to about 15 mm, or about 0 mm to about 10 mm, or about 0 mm to about 5 mm) to the plant (e.g., leaves, including top and/or bottom, stem, seed in ground, etc.). In some embodiments, the light emitting structure 20 (e.g., one or more of its light emitting structural members 10a and/or 10b) may provide support for the plant. In other words, the plant may rest and/or be supported upon the light emitting structure 20 as it grows up and/or into the light emitting structure 20. In some embodiments, the plant 5 may interweave into and through the light emitting structure 20.

The LEDs 1 and/or the array of LEDs may comprise any combination of color wavelengths and/or configurations. In some embodiments, the first level of light emitting structural members 10a and 10b may comprise blue LEDs (e.g., about 440 nm) and the remainder of the levels of light emitting structural members may comprise UV LED (e.g., 390 nm). In some embodiments, the first level of light emitting structural members (e.g., 10a, 10b) may comprise only blue LEDs (e.g., about 440 nm) and the remainder of the levels of light emitting structural (e.g., 10a, 10b) may comprise only UV LED (e.g., 390 nm). In some embodiments, the first level of light emitting structural members (e.g., 10a, 10b) may comprise blue LEDs (e.g., about 440 nm) and UV LED (e.g., 390 nm) interspersed and the remainder of the levels of light emitting structural members (e.g., 10a, 10b) may comprise UV LED (e.g., 390 nm) and red LEDs interspersed. In some embodiments, the one or more levels of the light emitting structure 20 may comprise blue LEDs (e.g., about 440 nm), UV LED (e.g., 390 nm), red LEDs, and/or any other colors/wavelengths that may be desirable. These differing LEDs may be interspersed along the light emitting structures.

Figure 3:
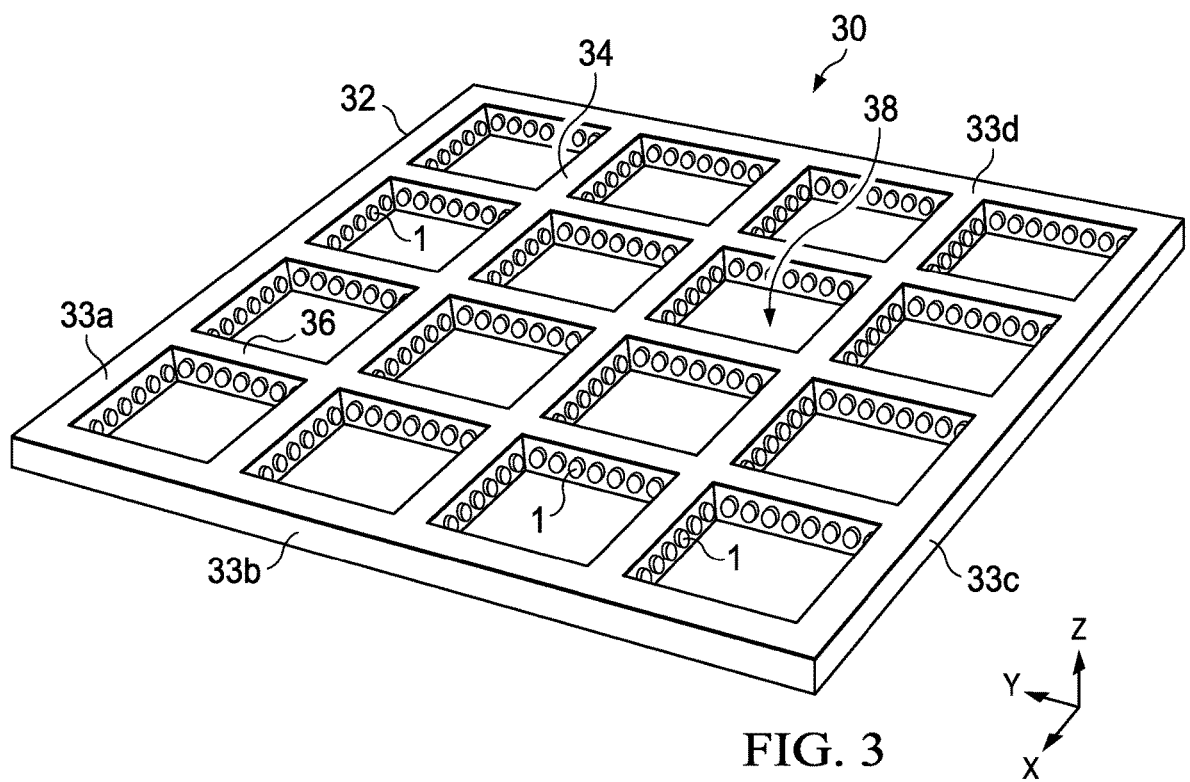
FIG. 3 is an isometric view of a light emitting structure according to one or more embodiments.

Referring to FIG. 3, another embodiment of a light emitting structure 30 is shown. The light emitting structure 30 may comprise a peripheral frame 32 which may comprise a first frame member 33a, a second frame member 33b, a third frame member 33c, and a fourth frame member 33d. The frame members 33a-33d may be integral such that they are a single component, or fixedly or detachably connected to each other using any of the connectors and/or connection methods (e.g., welds) set forth herein. The light emitting structure 30 may include a plurality of light emitting structural members 34 disposed horizontally (or substantially horizontally) parallel (or substantially parallel) to the X-axis and a plurality of light emitting structural members 36 disposed horizontally (or substantially horizontally) parallel (or substantially parallel) to the Y-axis to form a plurality of spaces 38 disposed between the light emitting structural members 34 and 36. In the embodiment shown, the structural members 34 may be positioned at a 90 degree angle (transverse) to the structural members 36. Each of the plurality of light emitting structural members 34 may be spaced apart from each other an equidistance or varied distance. Similarly, each of the plurality of light emitting structural members 36 may be spaced apart from each other an equidistance or varied distance.

In this embodiment, the peripheral frame 32 and plurality of light emitting structural members 34 and 36 are integral to each other. In this embodiment, the peripheral frame 32 and plurality of light emitting structural members 34 and 36 are made of aluminum and welded together at the joints. The peripheral frame 32 and plurality of light emitting structural members 34 and 36 are hollow aluminum members that provide a passageway for one or more lighting circuits (e.g., a convention wiring circuit(s) or a linear multi-conductor printed circuit laminate 14) to be contained within. The light emitting structure 30 may include a plurality of LEDs 1, as described herein, electrically connected to the one or more lighting circuits disposed within the passageway. In this embodiment, the LEDs 1 and the lighting circuit are integral to the light emitting structure 30. The peripheral frame 32 and plurality of light emitting structural members 34 and 36 may have a plurality of apertures disposed through one or more of its surfaces, enabling the LEDs 1 to be disposed therein such that the protrude outwardly from the surfaces of the peripheral frame 32 and plurality of light emitting structural members 34 and 36. As shown in FIG. 3, the LEDs 1 are disposed along the interior surfaces of the peripheral frame 32 and plurality of light emitting structural members 34 and 36. In some embodiments, the LEDs 1 may be disposed along other surfaces of the peripheral frame 32 and plurality of light emitting structural members 34 and 36 separately or in addition to the interior surfaces as shown in FIG. 3.

In some embodiments, the LEDs 1 may be flush with the surfaces. In some embodiments, a translucent glass or plastic window may be disposed within each of the apertures and the corresponding LED 1 is positioned inside the peripheral frame 32 and plurality of light emitting structural members 34 and 36, transmitting light through the window outwardly from the peripheral frame 32 and plurality of light emitting structural members 34 and 36. In some embodiments, one or more of the assemblies (e.g., printed circuit laminate 14, LEDs, and/or silicone sealant 16) may be laminated onto one or more of the surfaces of the peripheral frame 32 and plurality of light emitting structural members 34 and 36. In such an embodiment, the LEDs 1 and lighting circuit(s) are integral to the light emitting structure.

In some embodiments, the peripheral frame 32 and plurality of light emitting structural members 34 and 36 are formed out of a polymer material using conventional or yet-to-be development polymer molding methods, including but not limited to injection molding, thermoforming, compression molding, blow molding, gas assist molding, structural foam molding, combinations thereof, or similar methods. In some embodiments the peripheral frame 32 and plurality of light emitting structural members 34 and 36 may be fabricated from metals, plastics, composites, combinations thereof, or similar materials using conventional or yet-to-be developed forming methods, including but not limited to 3D printing.

In other embodiments, the peripheral frame 32 and plurality of light emitting structural members 34 and 36 may be detachably connected to each other using any of a variety of connectors or connection methods as set forth herein, enabling the disassembly of the structure 30 without damaging or destroying a plant or mitigating or minimizing damage to the one or more plants that may be growing up through one or more of the spaces 38.

Figure 4:
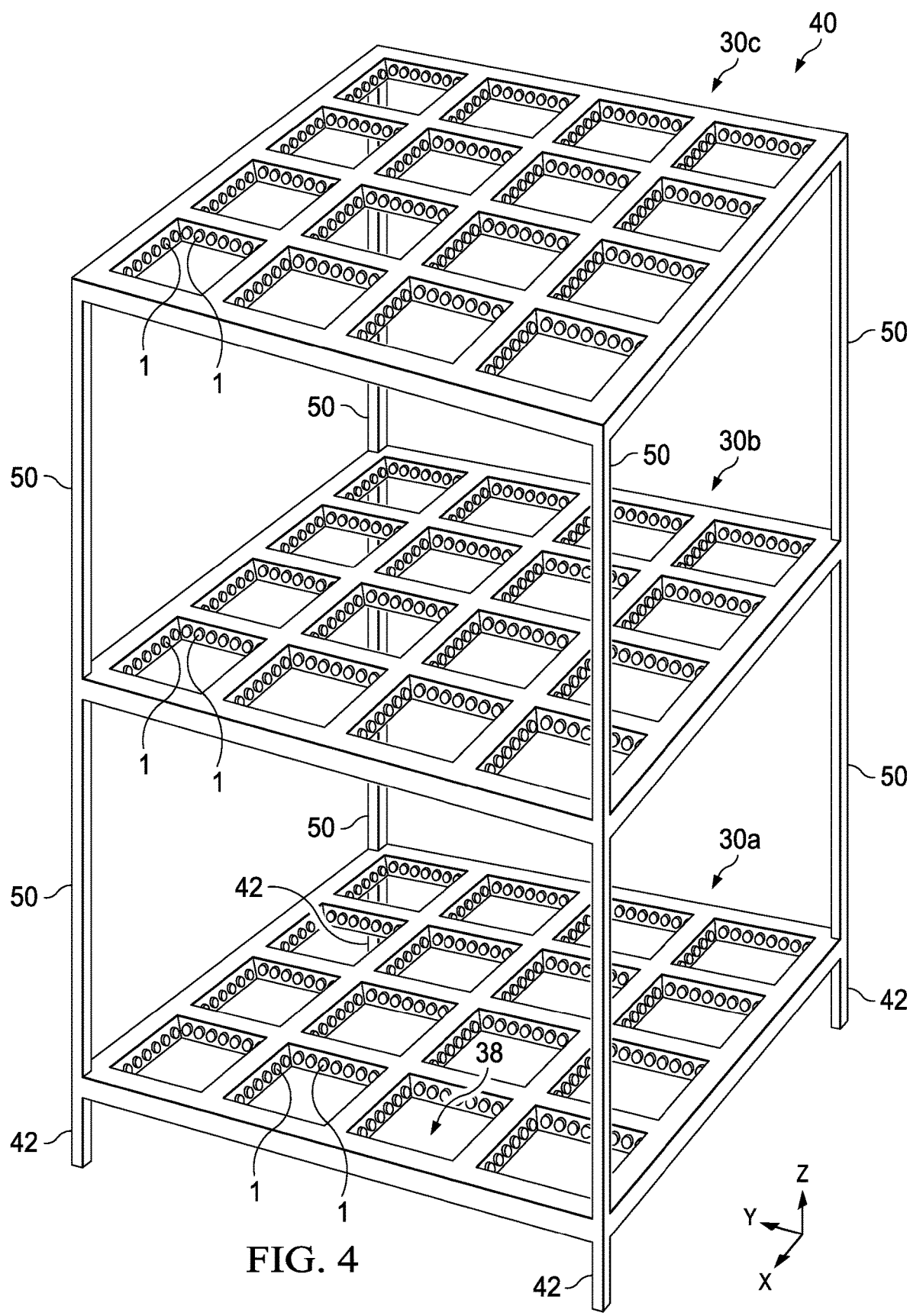
FIG. 4 is an isometric view of a plurality of the light emitting structure of FIG. 1 assembled together.

Referring to FIG. 4, an embodiment of a light emitting structure or assembly is shown as 40. In some embodiments, the light emitting assembly 40 may include one or more light emitting structures 30 that may be either suspended from an overhead support structure (e.g., ceiling or overhead framework) via rods, bars, wire, rope, string, combinations thereof, and/or other various hangers, or include legs 42 that extend downwardly from at least one of the light emitting structures 30 to support the light emitting structure 30. As shown in FIG. 4, the light emitting assembly 40 includes a plurality of light emitting structures 30a, 30b, and 30c assembled together along a Z-axis For example, the first light emitting structure 30a is assembled or connected to the second light emitting structure 30b using one or more vertical frame members 50, and the second light emitting structure 30b is connected to the third light emitting structure 30c using one or more vertical frame members 50, forming a lattice or scaffolding structure or assembly. In some embodiments, the one or more vertical frame members 50 may be fixedly or detachably connected to the respective light emitting structures 30a, 30b, and 30c. In some embodiments, the one or more vertical frame members 50 may be formed such that the one or more vertical frame members are integral to the light emitting structures 30a, 30b, and 30c. As shown, the light emitting assembly 40 may include one or more legs 42 that may be fixedly or detachably connected to the light emitting structure 30a such that each leg extends downwardly from the light emitting structure 30a. A distal end of each leg 42 may rest upon a surface, i.e., ground, floor, etc., or be connected to a pot, planter, and/or hydroponic unit/planter. In embodiments in which the light emitting assembly 40 is suspended from the ceiling, the legs 42 may be removed or not included. Whether suspended from the ceiling or supported upon a surface, the light emitting assembly 40 is positioned above the ground, soil, pot, planter, and/or hydroponic unit/planter such that one or more plants may grow up through the one or more of the spaces 38.

In some embodiments, the light emitting assembly 40 may be positioned such that one or more plants may grow into and up through one or more of the spaces 38 such that light emitting assembly 40 (i.e., one or more of the light emitting structures 30a-30c) may introduce and/or direct light from a variety of angles and sides and, in some cases, at close proximities (e.g., about 0 mm to about 500 mm, or about 0 mm to about 250 mm, or about 0 mm to about 150 mm, or about 0 mm to about 75 mm, or about 0 mm to about 50 mm, or about 0 mm to about 25 mm, or about 0 mm to about 15 mm, or about 0 mm to about 10 mm, or about 0 mm to about 5 mm) to the plant (e.g., leaves, including top and/or bottom, stem, seed in ground, etc.). In some embodiments, the light emitting assembly 40 (e.g., one or more of its light emitting structural members 34 and/or 36) may provide support for one or more plants. In other words, the one or more plants may rest and/or be supported upon the light emitting assembly 40 as the one or more plants grow up and/or into the light emitting assembly 40. In some embodiments, the one or more plants may interweave into and through spaces 38 of one or more of the light emitting structures 30a-30c of the light emitting assembly 40.

The LEDs 1 and/or the array of LEDs may comprise any combination of color wavelengths and/or configurations. In some embodiments, the first light emitting structure 30a may comprise blue LEDs (e.g., about 440 nm) and the remainder of the light emitting structures (e.g., 30b and 30c) may comprise UV LED (e.g., 390 nm). In some embodiments, the first light emitting structure 30a may comprise only blue LEDs (e.g., about 440 nm) and the remainder of the light emitting structures (e.g., 30b and 30c) may comprise only UV LED (e.g., 390 nm). In some embodiments, the first light emitting structure 30a may comprise blue LEDs (e.g., about 440 nm) and UV LED (e.g., 390 nm) interspersed and the remainder of the light emitting structures (e.g., 30b and 30c) may comprise UV LED (e.g., 390 nm) and red LEDs interspersed. In some embodiments, the one or more light emitting structure (e.g., 30a, 30b, 30c) may comprise blue LEDs (e.g., about 440 nm), UV LED (e.g., 390 nm), red LEDs, and/or any other colors/wavelengths that may be desirable. These differing LEDs may be interspersed along the light emitting structures.

Figure 5:
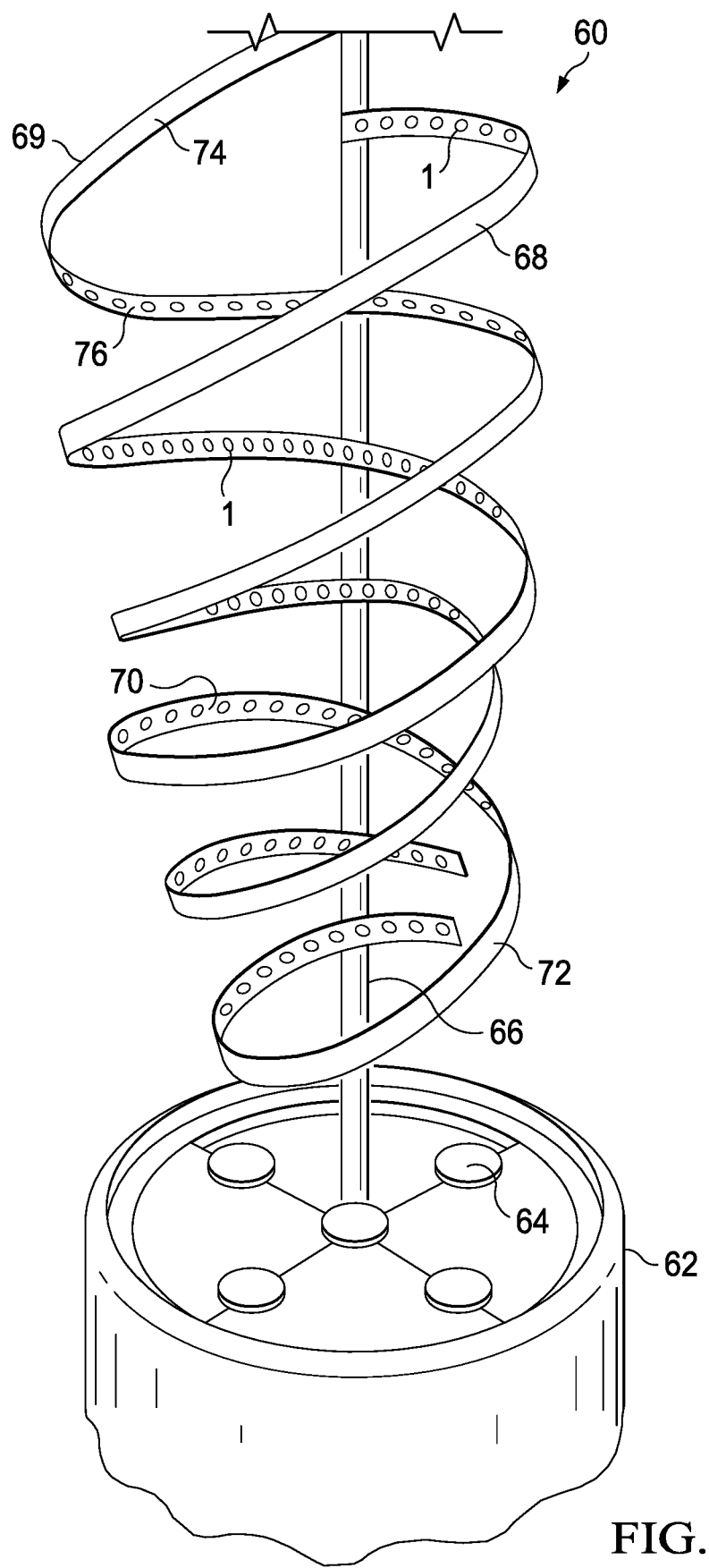
FIG. 5 is an isometric view of a light emitting structure according to one or more embodiments.

Referring to FIG. 5, an embodiment of a light emitting structure is shown as 60. The light emitting structure 60 may include a base 62. In some embodiments, the base 62 may comprise a pot, planter, and/or a hydroponic unit/planter. In this embodiment, base 62 is a hydroponic planter having one or more plant pods 64 as known in the art. The base 62 may include a vertical frame member 66 extending upwardly from the base.

Figure 6:
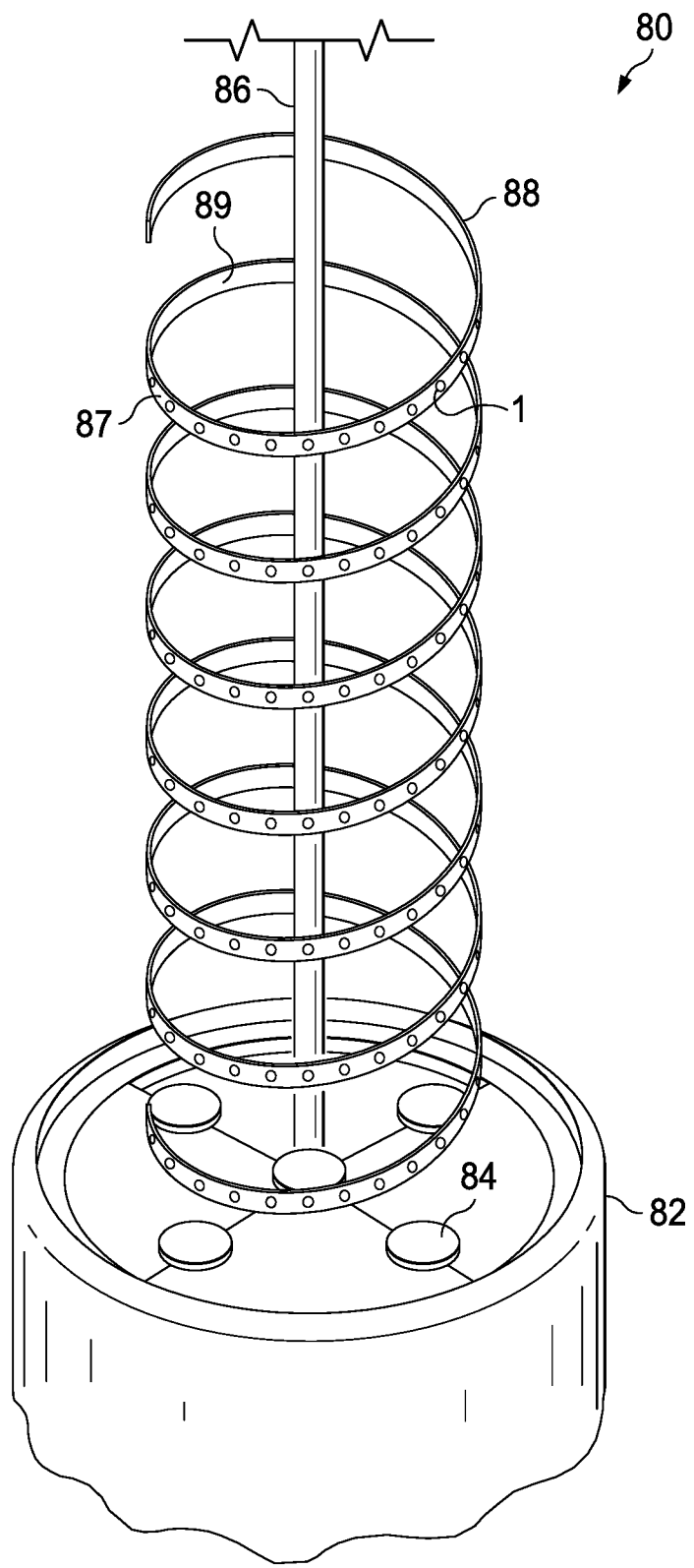
FIG. 6 is an isometric view of a light emitting structure according to one or more embodiments.

The light emitting structure 60 may include one or more light emitting structural members such as, for example, first and second light emitting structural members 68 and 69. An end of each of the one or more light emitting structural members (e.g., first light emitting structural member 68 and second light emitting structural member 69) may be connected to an upper portion of the vertical frame member 66 and then formed such that each of the one or more light emitting structural members spirals downwardly toward the base 62, using any one or more of the connectors and/or connections methods set forth herein. In some embodiments, the one or more light emitting structural members (e.g., first light emitting structural member 68 and second light emitting structural member 69) may be connected to the base 62 or positioned and supported upon the base without being attached the base or vertical frame member. The spiral may be a random configuration or a symmetrical configuration (e.g., helical; FIG. 6). The one or more light emitting structural members (e.g., first light emitting structural member 68 and second light emitting structural member 69) may be fabricated from sheet aluminum, other sheet metals, or extruded aluminum bar stock.

The light emitting structure 60 may include one or more of the assemblies (e.g., printed circuit laminate 14, LEDs 1, and/or silicone sealant 16) laminated onto one or more of the surfaces of the one or more light emitting structural members 68 and 69. The assemblies (e.g., printed circuit laminate 14, LEDs 1, and/or silicone sealant 16) and any of its components are integral to the light emitting structure 60. As shown, the one or more of the assemblies (e.g., printed circuit laminate 14, LEDs, and/or silicone sealant 16) are laminated onto an inside surface 70 of the first light emitting structural member 68 and an inside surface 76 of the second light emitting structural member 69. However, it is understood that other surfaces may include the one or more of the assemblies (e.g., printed circuit laminate 14, LEDs, and/or silicone sealant 16), including but not limited to outer surfaces 72 and 74, the surfaces on the vertical frame 66 and/or the base 62. The LEDs 1 and/or the array of LEDs may comprise any combination of color wavelengths and/or configurations, including but not limited to those disclosed herein.

In some embodiments, the one or more structural members 68 and 69 may be fabricated from a bar (e.g., aluminum bar stock) that is hollow or has a passageway through it along its long axis. The LED's and lighting circuit may be disposed within the hollow bar or passageway such that the LEDs protrude through apertures within the bar or at least constructed such that the LED's may emit light through the apertures and from the bar as described herein with reference to other embodiments.

Referring to FIG. 6, an embodiment of a light emitting structure is shown as 80. The light emitting structure 80 may include a base 82. In some embodiments, the base 82 may comprise a pot, planter, and/or a hydroponic unit/planter as set forth above with reference to FIG. 5. In this embodiment, base 62 also includes one or more plant pods 84 as known in the art. The base 82 may include a vertical frame member 86 extending upwardly from the base.

The light emitting structure 80 may include one or more light emitting structural members such as, for example, a light emitting structural member 88. An end of the light emitting structural member 88 may be connected to an upper portion of the vertical frame member 86 or to the base 82. The structural member 88 may also be positioned and supported upon the base 82 without being attached the base or vertical frame member. The structural member 88 may be connected using any one or more of the connectors and/or connections methods set forth herein. The structural member 88 may be formed such that it spirals downwardly toward the base 82 in a helical configuration. The structural member 88 may be fabricated from sheet aluminum, other sheet metals, or extruded aluminum bar stock.

The light emitting structure 80 may include one or more of the assemblies (e.g., printed circuit laminate 14, LEDs 1, and/or silicone sealant 16) laminated onto one or more of the surfaces of the structural member 88. The assemblies (e.g., printed circuit laminate 14, LEDs 1, and/or silicone sealant 16) and any of its components are integral to the light emitting structure 80. As shown, the one or more of the assemblies (e.g., printed circuit laminate 14, LEDs, and/or silicone sealant 16) are laminated onto an outer surface 87 of the structural member 88. However, it is understood that other surfaces may include the one or more of the lighting assemblies, including but not limited to inner surface 89, the surfaces on the vertical frame 86 and/or the base 82. The LEDs 1 and/or the array of LEDs may comprise any combination of color wavelengths and/or configurations, including but not limited to those disclosed herein.

Referring to FIGS. 5 and 6, the light emitting structures 60, 80 are constructed such that one or more plants may grow upwardly from the respective one or more pods 64, 84 into, through, and/or around (e.g., interweave) the respective structural members 68, 69, 88. In some embodiments, the light emitting structures 60, 80 are constructed such that the respective structural members 68, 69, 88 support one or more portions of the one or more plants.

Figure 7:
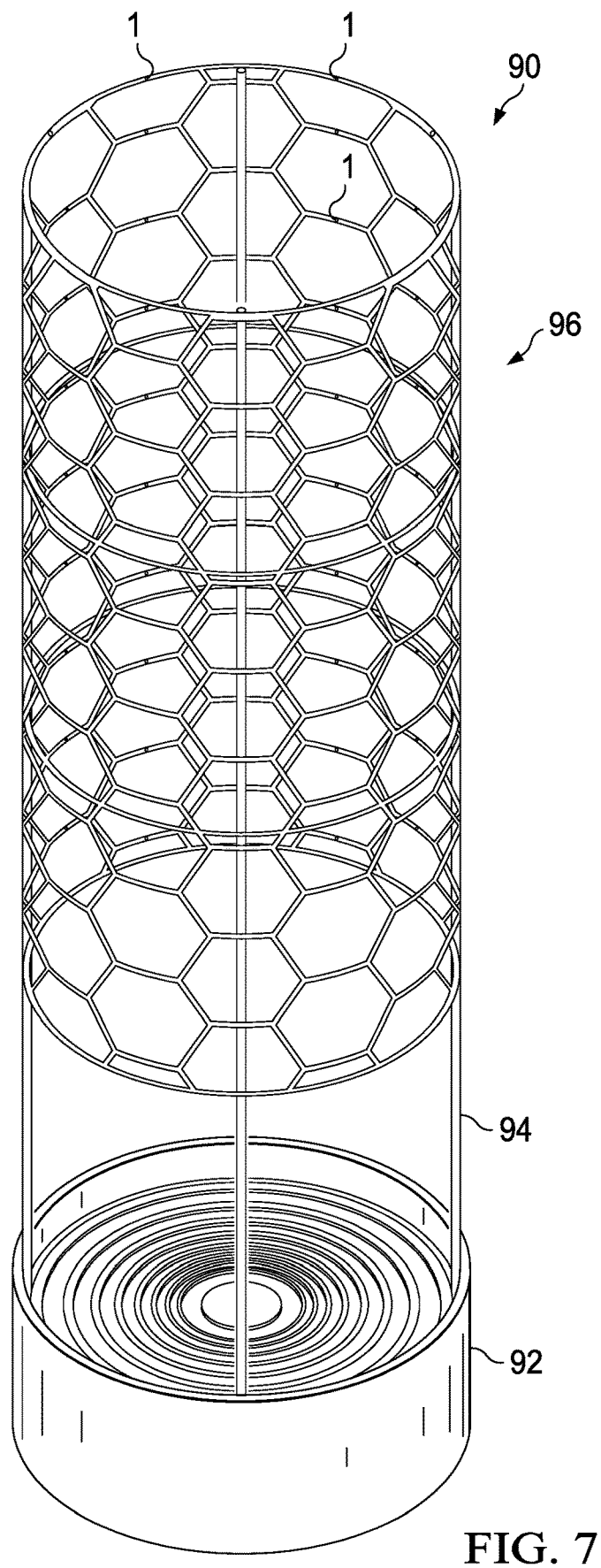
FIG. 7 is an isometric view of a light emitting structure according to one or more embodiments.

Referring to FIG. 7, an embodiment of a light emitting structure is shown as 90. The light emitting structure 90 may include a base 92. The base may be constructed to hold and/or support a planting pot or act as a planting pot itself. The light emitting structure 90 may have one or more vertical frame members 94 extending upwardly from the base 92. The light emitting structure 90 may include a lighting matrix or lattice structure 96 connected integrally to the vertical frame members 94. The light lattice structure 96 may comprise a plurality of LEDs 1 positioned all about the lattice structure 96. In some embodiments, the light lattice structure 96 may be rigid, semi-rigid, or flexible. In some embodiments, the light lattice structure 96 may be an LED net or a scrog net with LED lights and lighting circuit. In both such embodiments, the LED lights and lighting circuit are integral to the net and/or scrog net. In some embodiments, the LED net or LED scrog net may be flexible or semi-rigid.

Figure 8:
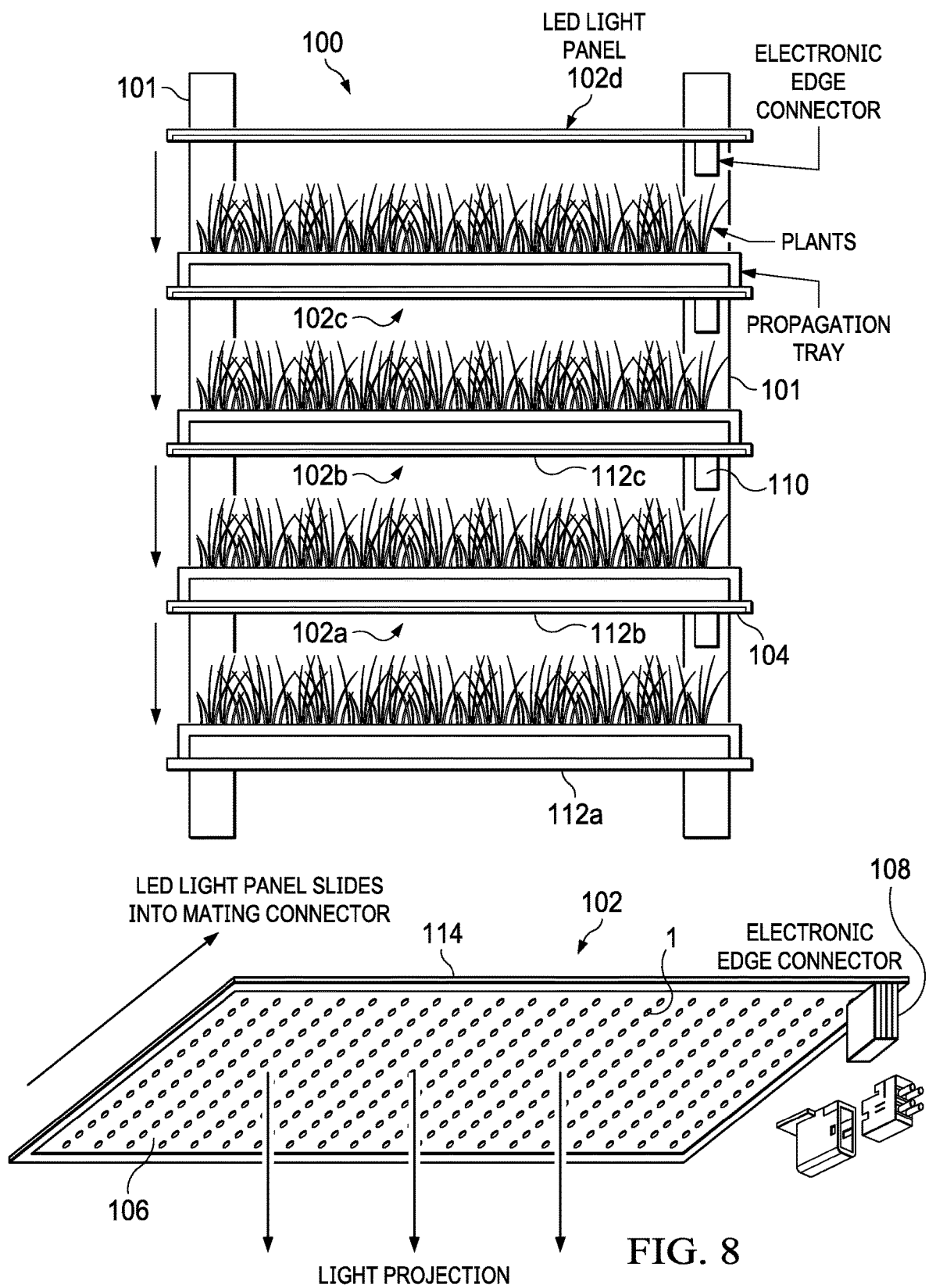
FIG. 8 is an isometric view of a light emitting structure according to one or more embodiments.

Referring to FIG. 8, an embodiment of a light emitting structure is shown as 100. The light emitting structure 100 may include a framework having one or more vertical frame members 101 and one or more horizontal frame members 104 connected to the vertical frame members 101. The vertical and horizontal frame members may be fixedly or detachably connected to one another to form a vertical rack or shelving configuration similar to propagation platforms used in horticulture. The framework may include positions for a plurality of plant trays or propagation trays 112 (e.g., a first propagation tray 112a, a second propagation tray 112b, a third propagation tray 112c, nth propagation tray 112n) to slide into as conventionally known. In some embodiments, each of these positions may have support members that the propagation trays may slide onto and be supported upon such as upon one or more of the horizontal frame members. In some embodiments the trays have protrusions that extend horizontally from the ends of the trays and slide into respective horizontal slots on the frame.

The light emitting structure 100 may also include a plurality of LED light panels 102 (e.g., a first LED light panel 102a, a second LED light panel 102b, a third LED light panel 102c, a nth LED light panel 102n) that is constructed to slide into respective mating connectors (e.g., horizontal slots) along the frame for receiving each LED light panel 102 and holding it in place above a respective propagation tray positioned directly below the LED light panel 102. For example, the first LED light panel 102a is positioned just below the second propagation tray 112b and directly above the first propagation tray 112a, the second LED light panel 102b is positioned just below the third propagation tray 112c and directly above the second propagation tray 112b.

The LED light panels 102 may include an outer panel frame 114 that may be rigid or semi-rigid. This frame may be constructed to slide into the respective mating slots along the light emitting structure's framework. The LED light panels 102 may include an LED substrate 106 disposed within the outer panel frame 114 and having a plurality of LEDs disposed thereon for propagating light and/or light emission. The LED light panels 102 may further include an electric and/or electronic connector 108 disposed along the outer panel frame 114. The framework of the light emitting structure 100 may include a corresponding, mating electric and/or electronic connector 110 for connecting to the respective electric and/or electronic connector 108 on the panels 102 in order to provide power, control signals, and/or any other data between the framework and the panels 102 (e.g., to provide power from an AC outlet, along the framework, through the connector 110 to the connector 108, to the LED panels 102. The LED light panels and/or the array of LEDs may comprise any combination of color wavelengths and/or configurations, including but not limited to those (e.g., LEDs 1) disclosed herein.

Figure 9:
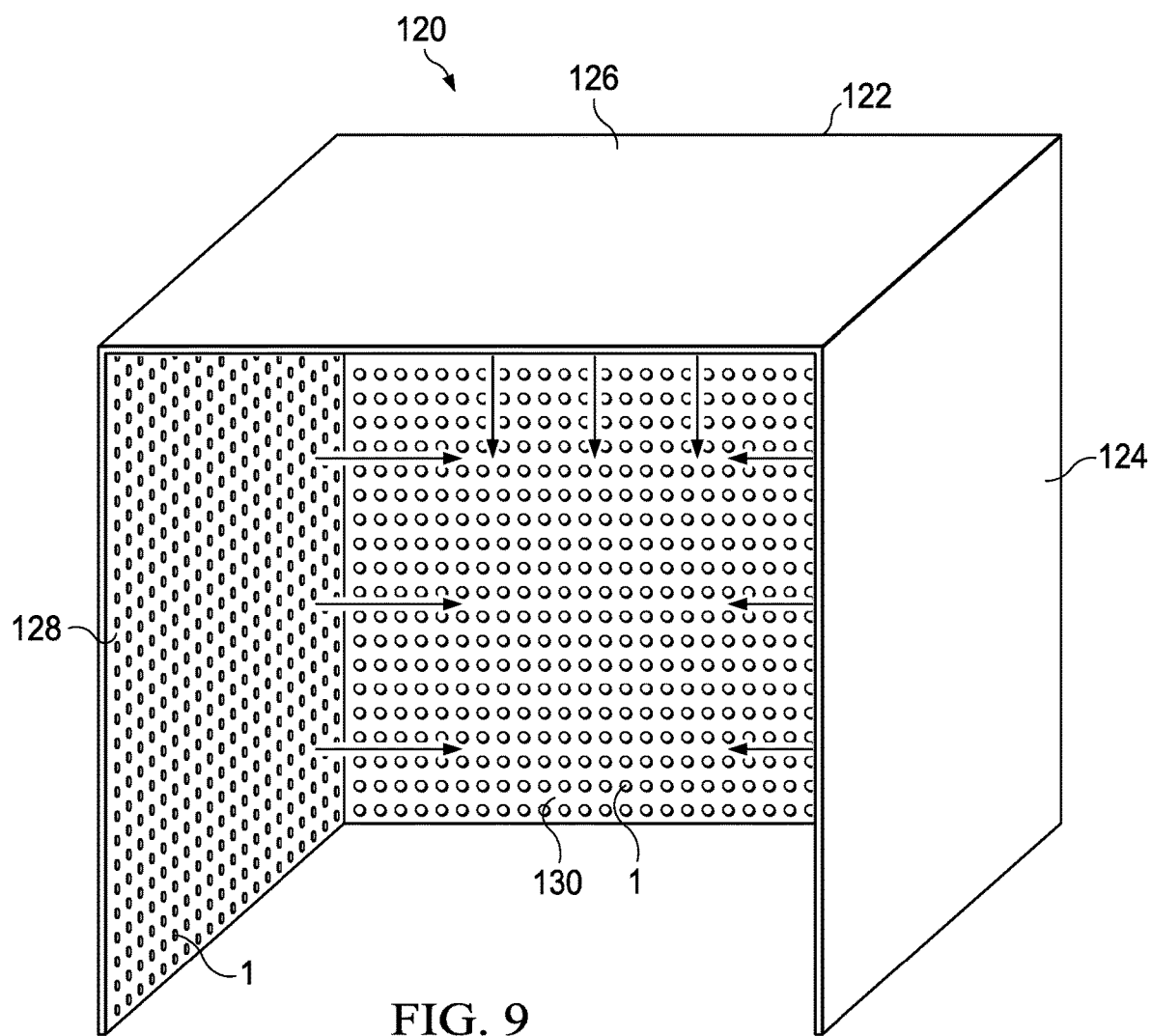
FIG. 9 is an isometric view of a light emitting structure according to one or more embodiments.

Referring to FIG. 9, an embodiment of a light emitting structure is shown as 120. The light emitting structure 120 may comprise a LED tent. The light emitting structure 120 may include a framework 122 and a first side wall 124, a second side 128, a top wall 126, and a back wall 130 connected to the framework. In some embodiments, the structure 120 may further include a front wall (not shown) connected to the framework. The front wall may act as an door or opening to the interior of the light emitting structure 120. In some embodiments, the front wall may include a door disposed therethrough. The framework may be fabricated from rigid, semi-rigid, and/or flexible materials. In some embodiments, the framework is made from rods and supports the walls.

The walls may comprise LED net array or LED substrate panels. Both comprise a plurality of LEDs (e.g., LEDs 1) dispersed across the walls. The LEDS may be along an interior surface of the walls or configured to emit light inwardly into the interior of the structure 120 as shown. In some embodiments, the LED net array and/or LED substrates may be constructed such that they may permit light from outside the structure 120 (e.g., natural sunlight, primary overhead lighting such as, for example, HPS, fluorescent, incandescent, and/or LED). The LED net array and/or LED substrates may further include reflective materials to reflect and redirect light within the interior towards one or more plants or specific portions of the one or more plants growing within the structure 120. The LED light nets and/or LED substrates may comprise any combination of color wavelengths and/or configurations, including but not limited to those (e.g., LEDs 1) disclosed herein.

Figure 10:
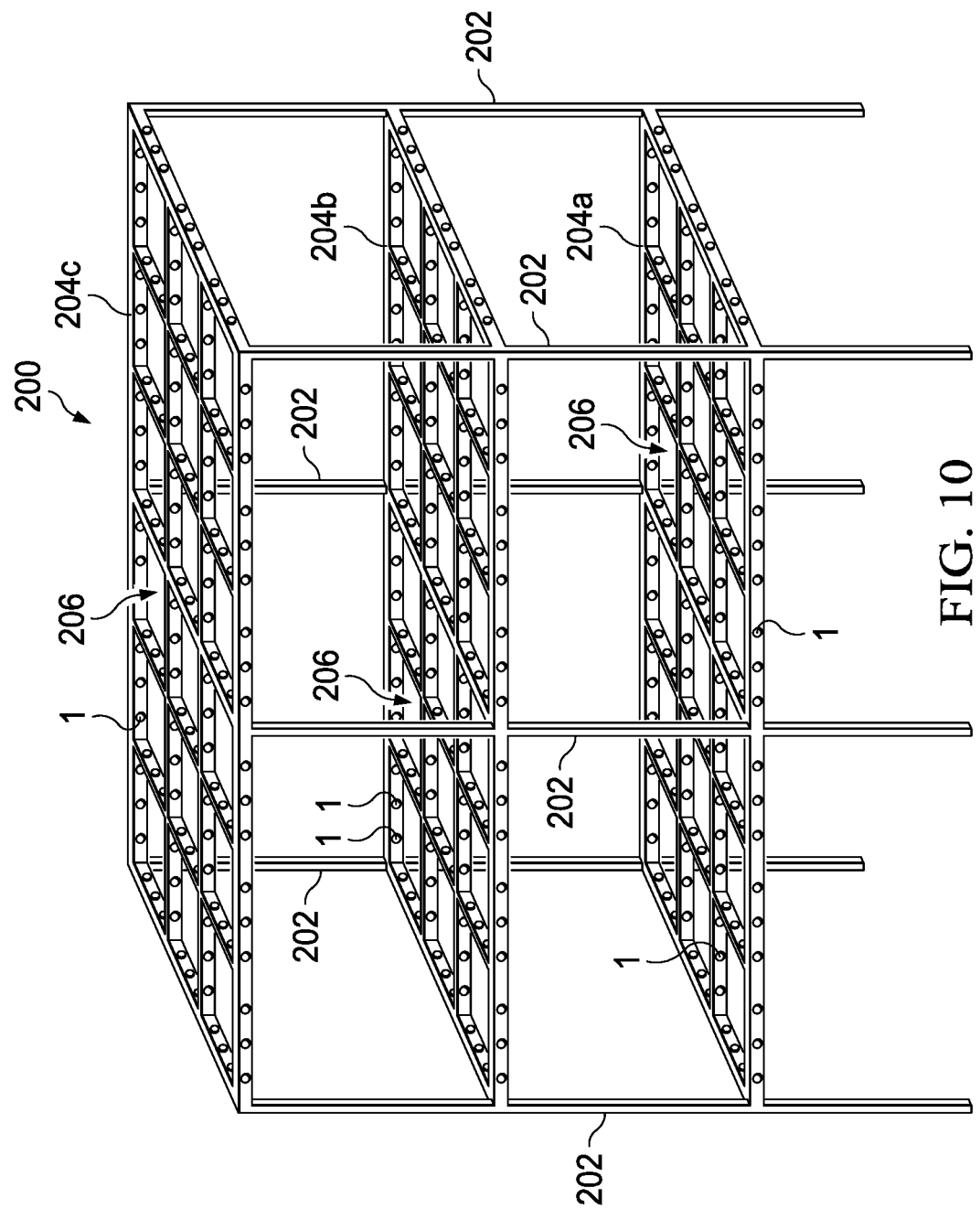
FIG. 10 is an isometric view of a light emitting structure according to one or more embodiments.

Referring to FIG. 10, an embodiment of a light emitting structure is shown as 200. The light emitting structure 200 may include a framework. The framework may include one or more vertical frame members 202 that support the structure 200 upon a surface (e.g., the ground or a floor). The light emitting structure 200 may further include a plurality of LED net arrays (e.g., a first LED net array 204a, a second LED net array 204b, a third LED net array 204c). It is understood that any number of net arrays may be used. The LED net arrays may include a plurality of LEDs dispersed all over the net array. The LED light panels and/or the array of LEDs may comprise any combination of color wavelengths and/or configurations, including but not limited to those (e.g., LEDs 1) disclosed herein.

In some embodiments, the vertical frame members 202 may also include LEDs 1 connected to them using any of the connectors and/or connections methods as set forth herein. As shown, the LED net arrays (e.g., 204a, 204b, 204c, include a plurality of spaces 206 that permit one or more plants to grow upwardly through one or more of the spaces 206. As shown, a distal end of each vertical frame member 202 may extend downwardly and rest upon a surface (e.g., ground, floor, etc., or be connected to a pot, planter, and/or hydroponic unit/planter). In some embodiments, the light emitting structure 200 may be suspended from an overhead support structure (e.g., ceiling or overhead framework) via rods, bars, wire, rope, string, combinations thereof, and/or other various hangers to support the light emitting structure 200. Whether suspended from the ceiling or supported upon a surface, the light emitting structure 200 is positioned above the ground, soil, pot, planter, and/or hydroponic unit/planter such that one or more plants may grow up through the one or more of the spaces 206. In some embodiments, the light emitting structure 200 (e.g., one or more of its LED net arrays 204a, 204b, 204c) may provide support for one or more plants. In other words, the one or more plants may rest and/or be supported upon the light emitting structure 200 as the one or more plants grow up and/or into the light emitting structure 200. In some embodiments, the one or more plants may interweave into and through the light emitting structure 200.

In some embodiments, the one or more light emitting structures and/or assemblies set forth above herein may not be controllable, i.e., the LEDs may only be controlled such that they may be turned on or off, or in some instances, dimmed as well. In other words, in some embodiments, the one or more light emitting structures and/or assemblies set forth above herein may be "dumb" systems. In some embodiments, the one or more light emitting structures and/or assemblies set forth above herein may be controllable and/or programmable, i.e., "smart," as will be disclosed below herein in some examples. Any of the light emitting structures and/or assemblies set forth herein may be powered by AC or DC current.

Figure 11:
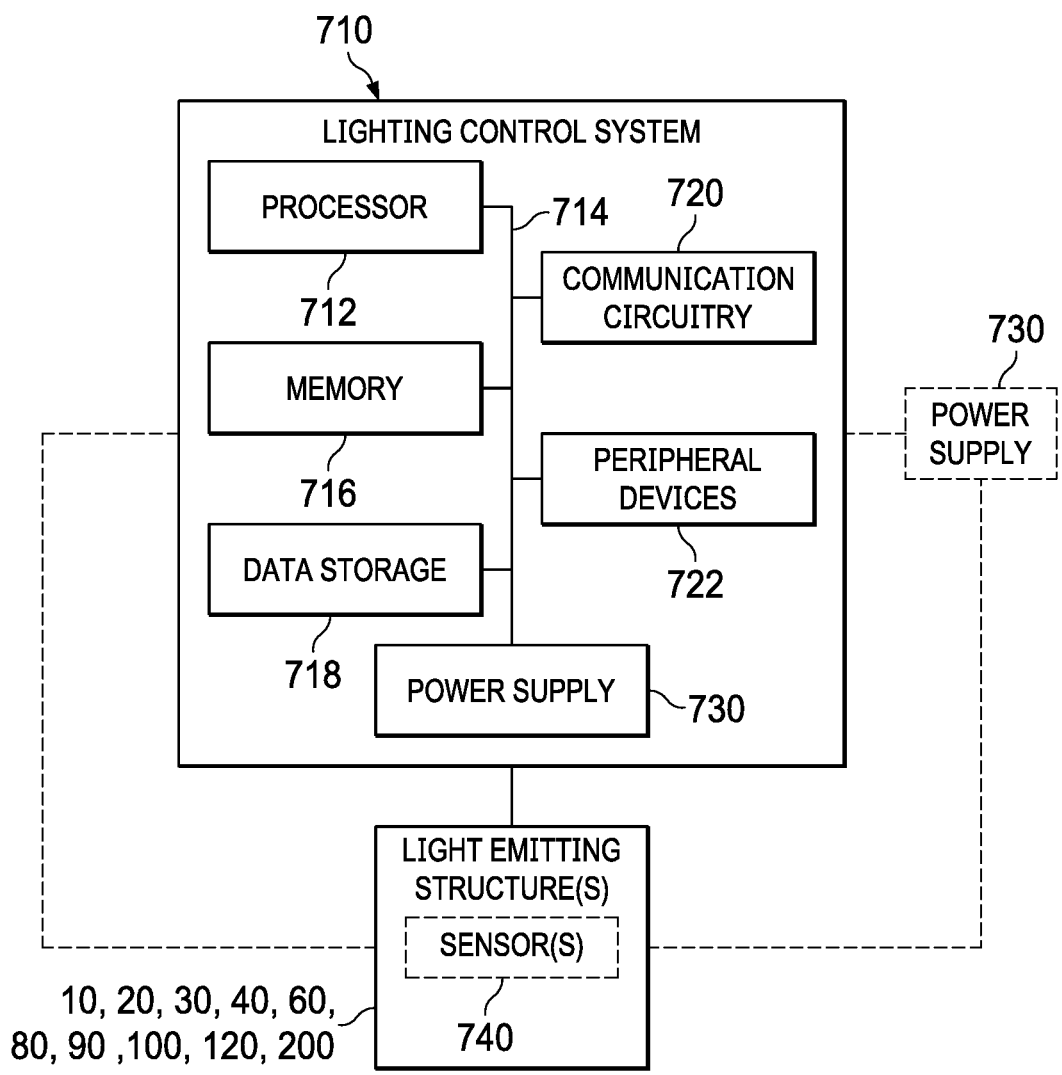
FIG. 11 is a simplified block diagram of a lighting control system for controlling light emitting diodes of the light emitting structures of FIGS. 1-10.

In embodiments such as the one illustratively shown in FIG. 11, operation of the LEDs 1 of the light emitting structures 10, 20, 30, 40, 60, 80, 90, 100, 120, 200 is controllable by way of a lighting control system 710 communicatively coupled thereto. The lighting control system 710 can be embodied as any type of computing device, server, or control device capable of processing, communicating, storing, maintaining, and transferring data. For example, the lighting control system 710 can be embodied as a server, a microcomputer, a minicomputer, a mainframe, a desktop computer, a laptop computer, a mobile computing device, a handheld computer, a smart phone, a tablet computer, a personal digital assistant, a telephony device, a custom chip, an embedded processing device, a programmable logic controller, a programmable automation controller, a programmable logic relay, a programmable timer, or any other computing device and/or suitable programmable device. In some embodiments, the lighting control system 710 can be embodied as a computing or control device integrated with other systems or subsystems. In the illustrative embodiment of FIG. 11, the lighting control system 710 includes a processor 712, a system bus 714, a memory 716, a data storage 718, communication circuitry 720, one or more peripheral devices 722, and a power supply 730. Of course, the lighting control system 710 can include other or additional components, such as those commonly found in a computer, server, and/or control device (e.g., various input/output devices), in other embodiments. Additionally, in some embodiments, one or more of the illustrative components can be incorporated in, or otherwise from a portion of, another component. For example, the memory 716, or portions thereof, can be incorporated in the processor 712 in some embodiments. Furthermore, it should be appreciated that the lighting control system 710 can include other components, sub-components, and devices commonly found in a computing device, server, and/or controller, which are not illustrated in FIG. 11 for clarity of the description.

The processor 712 can be embodied as any type of processor capable of performing the functions described herein. For example, the processor 712 can be embodied as a single or multi-core processor, a digital signal processor, a microcontroller, a general purpose central processing unit (CPU), a reduced instruction set computer (RISC) processor, a processor having a pipeline, a complex instruction set computer (CISC) processor, an application specific integrated circuit (ASIC), a programmable logic device (PLD), a field programmable gate array (FPGA), or any other type of processor or processing/controlling circuit or controller.

In various configurations, the lighting control system 710 includes a system bus 714 for interconnecting the various components of the lighting control system 710. The system bus 714 can be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations with the processor 712, the memory 716, and other components of the lighting control system 710. In some embodiments, the lighting control system 710 can be integrated into one or more chips such as a programmable logic device or an application specific integrated circuit (ASIC). In such embodiments, the system bus 714 can form a portion of a system-on-a-chip (SoC) and be incorporated, along with the processor 712, the memory 716, and other components of the lighting control system 710, on a single integrated circuit chip.

The memory 716 can be embodied as any type of volatile or non-volatile memory or data storage capable of performing the functions described herein. For example, the memory 716 can be embodied as read only memory (ROM), random access memory (RAM), cache memory associated with the processor 712, or other memories such as dynamic RAM (DRAM), static RAM (SRAM), programmable ROM (PROM), electrically erasable PROM (EEPROM), flash memory, a removable memory card or disk, a solid state drive, and so forth. In operation, the memory 716 can store various data and software used during operation of the lighting control system 710 such as operating systems, applications, programs, libraries, and drivers.

The data storage 718 can be embodied as any type of device or devices configured for short-term or long-term storage of data such as, for example, memory devices and circuits, memory cards, hard disk drives, solid-state drives, or other data storage devices. For example, in some embodiments, the data storage 718 includes storage media such as a storage device that can be configured to have multiple modules, such as magnetic disk drives, floppy drives, tape drives, hard drives, optical drives and media, magneto-optical drives and media, Compact Disc (CD) drives, Compact Disc Read Only Memory (CD-ROM), Compact Disc Recordable (CD-R), Compact Disc Rewriteable (CD-RW), a suitable type of Digital Versatile Disc (DVD) or Blu-Ray disc, and so forth. Storage media such as flash drives, solid state hard drives, redundant array of individual disks (RAID), virtual drives, networked drives and other memory means including storage media on the processor 712, or the memory 716 are also contemplated as storage devices. It should be appreciated that such memory can be internal or external with respect to operation of the disclosed embodiments. It should also be appreciated that certain portions of the processes described herein can be performed using instructions stored on a computer-readable medium or media that direct or otherwise instruct a computer system or a control device to perform the process steps. Non-transitory computer-readable media, as used herein, comprises all computer-readable media except for transitory, propagating signals.

The communication circuitry 720 of the lighting control system 710 may be embodied as any type of communication circuit, device, interface, or collection thereof, capable of enabling communications between the lighting control system 710 and any other computing devices communicatively coupled thereto. For example, the communication circuitry 720 may be embodied as one or more network interface controllers (NICs), in some embodiments. The communication circuitry 720 may be configured to use any one or more communication technologies (e.g., wireless or wired communications) and associated protocols (e.g., Ethernet, Wi-Fi®, WiMAX, etc.) to effect such communication. In some embodiments, the communication circuitry 720 may be configured to communicate with one or more sensors 740 (e.g., humidity sensors, temperature sensors, moisture sensors, oxygen sensors, carbon dioxide sensors, light sensors, UV sensors, pH sensors, chemical sensors, proximity sensors, etc.) attached to, incorporated within, or otherwise in close proximity to the light emitting structure(s) 10, 20, 30, 40, 60, 80, 90, 100, 120, 200. In such embodiments, the lighting control system 710 can receive sensed environmental or plant growth data from the one or more sensors 740. As discussed herein, the lighting control system 710 can, in some embodiments, use the environmental or plant growth data received from the sensors 740 to control one or more of the LEDs 1 of the light emitting structure(s).

In some embodiments, the lighting control system 710 and/or any other computing or control devices (e.g., the sensor(s) 740) can communicate with each other over one or more networks (not shown). The network(s) can be embodied as any number of various wired and/or wireless communication networks. For example, the network(s) can be embodied as or otherwise include a local area network (LAN), a wide area network (WAN), a cellular network, or a publicly-accessible, global network such as the Internet. Additionally, the network(s) can include any number of additional devices to facilitate communication between the lighting control system 710 and/or any other computing or control devices.

Additionally, in some embodiments, the lighting control system 710 can further include one or more peripheral devices 722. Such peripheral devices 722 can include any type of peripheral device commonly found in a computing or control device such as additional data storage, speakers, a hardware keyboard, a keypad, a gesture or graphical input device, a motion input device, a touchscreen interface, one or more displays, an audio unit, a voice recognition unit, a vibratory device, a computer mouse, a peripheral communication device, and any other suitable user interface, input/output device, and/or other peripheral device.

As discussed, the illustrative lighting control system 710 includes the power supply 730. In other embodiments, the power supply 730 may be a separate and distinct component in communication with the lighting control system 710. In either case, the power supply 730 may be configured to output one or more power signals to one or more LEDs 1 of the light emitting structure(s) 10, 20, 30, 40, 60, 80, 90, 100, 120, 200 in electrical communication therewith based on one or more control signals generated by the lighting control system 710. In some embodiments, the power supply 730 may be constructed to selectively output the one or more power signals to one or more of the LEDs 1 or groups of LEDs 1 of the light emitting structure(s) 10, 20, 30, 40, 60, 80, 90, 100, 120, 200. For example, in some embodiments, the power supply 730 can be constructed to utilize one or more controllable switches to selectively supply the power signal(s) to one or more of the LEDs 1. It should be appreciated that, in other embodiments, the power supply 730 can include any other mechanism for switching and routing power signals to the LEDs 1 of the light emitting structure(s).

The lighting control system 710 can be configured or constructed to selectively and individually control one or more of the LEDs 1, in some embodiments. For example, referring to FIG. 1B, the lighting control system 710 can be configured to selectively activate (e.g., energize, illuminate, operate, etc.) and/or deactivate (e.g., de-energize, extinguish, etc.) the LED 1a and/or the LED 1b. Additionally or alternatively, the lighting control system 710 can be configured or constructed to selectively control one or more groups of the LEDs 1. For example, referring to the light emitting structure assembly 40 of FIG. 4, the lighting control system 710 can be configured to selectively activate and/or deactivate the LEDs 1 of the light emitting structure 30a, the LEDs 1 of the light emitting structure 30b, and/or the LEDs 1 of the light emitting structure 30c. Such selective control of one or more of the LEDs 1 and/or groups of the LEDs 1 of the light emitting structure(s) 10, 20, 30, 40, 60, 80, 90, 100, 120, 200 advantageously provides the ability to instigate specific photomorphology and/or desired secondary metabolistic attributes of plants, as a series of volumetrically addressable photonic transition events within a predetermined life cycle of a given plant genotype or cultivar.

In some embodiments, the lighting control system 710 can selectively and individually control the LEDs 1 and/or groups of the LEDs 1 of the light emitting structure(s) 10, 20, 30, 40, 60, 80, 90, 100, 120, 200 based at least in part on, or otherwise as a function of, one or more lighting recipes and/or reference lighting routines. In some embodiments, the lighting recipes and/or reference lighting routines can include one or more rules defining when specific LEDs 1 and/or groups of LEDs 1 should be activated or deactivated. For example, the lighting recipes and/or reference lighting routines can specify that specific LEDs 1, or groups of LEDs 1, should be activated and/or deactivated based on the time of day or time of year. In another example, the lighting recipes and/or reference lighting routines can specify that specific LEDs 1, or groups of LEDs 1, should be activated and/or deactivated based on sensor data received from the sensor(s) 740. In that way, optimal environmental conditions for growth of the plant can be maintained.

Additionally, in some embodiments, the lighting recipes and/or reference lighting routines can specify that different combinations of the LEDs 1 should be activated based on the growth cycle of a particular plant or cultivar. As discussed herein, the light emitting structure(s) 10, 20, 30, 40, 60, 80, 90, 100, 120, 200 can include LEDs 1 constructed to generate light having different wavelengths. For example, the light emitting structure(s) 10, 20, 30, 40, 60, 80, 90, 100, 120, 200 can include one or more LEDs 1 constructed to emit blue light (approx. 440 nm), one or more LEDs 1 to constructed to emit ultraviolet (UV) light (approx. 390 nm) or near-UV light (approx. 405 nm), one more LEDs 1 constructed to emit red light (approx. 630-660 nm), and/or one or more combinations thereof. It should be appreciated that the light emitting structure(s) 10, 20, 30, 40, 60, 80, 90, 100, 120, 200 can include one or more LEDs 1 constructed to emit different or additional colors (wavelengths) of light. In a specific example, referring to the light emitting structure assembly 40 of FIG. 4, the light emitting structure 30*a* may include LEDs 1 constructed to emit blue light (approx. 440 nm) for affecting the structural morphology of a growing plant or cultivar. Continuing with the same example, the light emitting structure 30*b*, which may be positioned above the light emitting structure 30*a*, may include a different set of LEDs 1 constructed to emit UV light (approx. 390 nm) for inducing metabolic stress on the growing plant or cultivar to increase or otherwise affect the production of various biochemical compounds of interest (e.g., terpenoid, etc.). In such example, the lighting recipe and/or reference lighting routine can specify that the blue light emitting LEDs 1 of the light emitting structure 30*a* should be activated during one phase of the plant's growth cycle to, for example, induce the plant to grow into a smaller, higher density spatial configuration, but still produce a sufficiently relevant yield of desired product, such as flowers and/or fruit. The lighting recipe and/or reference lighting routine can further specify that the UV emitting LEDs 1 of the light emitting structure 30*b* should be activated during another phase of the plant's growth cycle to, for example, induce metabolistic stress in the plant. In some embodiments, the lighting recipe and/or reference lighting routine can further specify that the LEDs 1 of the light emitting structure 30*a* should be deactivated when the LEDs 1 of the light emitting structure 30*b* are activated and vice versa.

As discussed herein, the lighting control system 710, as a function of one or more lighting recipes and/or reference lighting routines, can generate and transmit one or more control signals to the power supply 730, in some embodiments. Upon receipt of the control signals, the power supply 730 can generate and selectively supply one or more power signal(s) to one or more of the LEDs 1 to cause activation thereof. In other embodiments, each of the LEDs 1 of the light emitting structure(s) 10, 20, 30, 40, 60, 80, 90, 100, 120, 200 can be individually addressable and controllable by signals generated by the lighting control system 710. In some embodiments, the lighting control system 710 can provide pulse width modulation amplitude control over specifically selected LEDs 1 of the light emitting structure(s) 10, 20, 30, 40, 60, 80, 90, 100, 120, 200. It should be appreciated that any other suitable mechanism can be used by the lighting control system 710 for selectively and individually controlling (e.g., activating, deactivating, etc.) one or more of the LEDs 1 of the light emitting structure(s) 10, 20, 30, 40, 60, 80, 90, 100, 120, 200.

It should be understood that any one or more of the embodiments of the light emitting structures set forth herein may include reflectors and/or reflective materials and/or coatings to redirect light at one or more of the plants growing within the light emitting structures and/or at one or more parts of the one or more plants. It should also be understood that that any one or more of the embodiments of the light emitting structures set forth herein may include materials that are translucent and/or transparent and/or may be constructed to permit additional light (e.g., natural sunlight, incandescent, fluorescent, HPS, LED, and/or other primary and/or secondary light sources from any number of angles and/or directions.

It should be understood that any feature and/or element of any one of the embodiments and/or examples shown and described above herein may be removed from the embodiment and/or example, replaced with a feature or element from another embodiment or example herein or replaced with an equivalent feature or element.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application, is hereby incorporated herein by reference in its entirety unless expressly excluded or otherwise limited. The citation of any document is not an admission that it is prior art with respect to any embodiment disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present disclosure have been illustrated and described, it would be obvious to those skilled in the art that various other changes and modifications can be made. It is therefore intended to cover in the appended claims all such changes and modifications.

What is claimed is:

1. A light emitting structure, comprising:
   a plurality of light emitting structural members, each light emitting structural member of the plurality of light emitting structural members comprises:
      an elongated member having opposing first and second side surfaces,
      a first plurality of light emitting diodes positioned on the first side surface of the elongated member, and
      a second plurality of light emitting diodes positioned on the second side surface of the elongated member;
   a first group of the plurality of light emitting structural members extending in a first direction and distributed in a second direction different from the first direction; and
   a second group of the plurality of light emitting structural members extending in the second direction and distributed in the first direction, the second group of the plurality of light emitting structural members positioned above the first group of the plurality of light emitting structural members.

2. The light emitting structure of claim 1, wherein the second group of the plurality of light emitting structural members is positioned on the first group of the plurality of light emitting structural members.

3. The light emitting structure of claim 1, wherein the second group of the plurality of light emitting structural members is coupled to the first group of the plurality of light emitting structural members.

4. The light emitting structure of claim 1, wherein the second direction is transverse to the first direction, the first group of the plurality of light emitting structural members are spaced apart in the second direction, and the second group of the plurality of light emitting structural members are spaced apart in the first direction.

5. The light emitting structure of claim 1, wherein each light emitting structural member of the plurality of light emitting structural members further comprises:
a first optically transmissive sealant layer encapsulating the first plurality of light emitting diodes; and
a second optically transmissive sealant layer encapsulating the second plurality of light emitting diodes.

6. The light emitting structure of claim 1, wherein each light emitting structural member of the plurality of light emitting structural members further comprises:
a first lighting circuit disposed on the first side surface of the elongated member;
a second lighting circuit disposed on the second side surface of the elongated member; and
wherein the first plurality of light emitting diodes are electrically connected to the first lighting circuit and the second plurality of light emitting diodes are electrically connected to the second lighting circuit.

7. The light emitting structure of claim 6, wherein the elongated member comprises aluminum bar stock.

8. The light emitting structure of claim 7, wherein the first and second lighting circuits comprise first and second circuit laminates, respectively.

9. The light emitting structure of claim 6, wherein each light emitting structural member of the plurality of light emitting structural members further comprises:
a first optically transmissive sealant layer encapsulating the first lighting circuit and the first plurality of light emitting diodes; and
a second optically transmissive sealant layer encapsulating the second lighting circuit and the second plurality of light emitting diodes.

10. The light emitting structure of claim 9, wherein the first lighting circuit, the first plurality of light emitting diodes, and the first optically transmissive sealant layer are coupled to the first side surface of the elongated member; and
wherein the second lighting circuit, the second plurality of light emitting diodes, and the second optically transmissive sealant layer are coupled to the second side surface of the elongated member.

11. The light emitting structure of claim 9, wherein the first lighting circuit, the first plurality of light emitting diodes, and the first optically transmissive sealant layer are laminated onto the first side surface of the elongated member; and
wherein the second lighting circuit, the second plurality of light emitting diodes, and the second optically transmissive sealant layer are laminated onto the second side surface of the elongated member.

12. The light emitting structure of claim 1, wherein the first plurality of light emitting diodes are distributed in a linear array along the first side surface of the elongated member; and
wherein the second plurality of light emitting diodes are distributed in a linear array along the second side surface of the elongated member.

13. The light emitting structure of claim 12, wherein the first plurality of light emitting diodes comprise:
a first group of light emitting diodes configured to emit light at a first wavelength;
a second group of light emitting diodes configured to emit light at a second wavelength different from the first wavelength; and
wherein the first group of light emitting diodes and the second group of light emitting diodes are interspersed along the first side surface of the elongated member.

14. The light emitting structure of claim 13, wherein each of the first group of light emitting diodes and the second group of light emitting diodes is configured to emit light selected from the group consisting essentially of UV light, near-UV light, blue light, red light, and far-red light.

15. The light emitting structure of claim 13, wherein the first plurality of light emitting diodes further comprise:
a third group of light emitting diodes configured to emit light at a third wavelength, the third wavelength different from the first and second wavelengths; and
wherein the first group of light emitting diodes, the second group of light emitting diodes, and the third group of light emitting diodes are interspersed along the first side surface of the elongated member.

16. The light emitting structure of claim 1, wherein the first group of the plurality of light emitting structural members and the second group of the plurality of light emitting structural members cooperate to define a lattice framework.

17. The light emitting structure of claim 1, wherein the elongated member of each light emitting structural member further comprises:
an interior surface defining a hollow interior section;
a first plurality of apertures disposed on and that extend from the first side surface of the elongated member to the hollow interior section;
a second plurality of apertures disposed on and that extend from the second side surface of the elongated member to the hollow interior section;
a lighting circuit disposed within the hollow interior section;
wherein each of the first plurality of light emitting diodes are received within a different one of the first plurality of apertures and are electrically connected to the lighting circuit disposed within the hollow interior section; and
wherein each of the second plurality of light emitting diodes are received within a different one of the second plurality of apertures and are electrically connected to the lighting circuit disposed within the hollow interior section.

18. The light emitting structure of claim 1, wherein each of the first group of light emitting diodes and the second group of light emitting diodes is configured to emit light having one of a wavelength between about 370 nm and 400 nm, a wavelength of about 405 nm, a wavelength of about 440 nm, a wavelength between about 630 nm and 660 nm, or a wavelength between about 710 nm and about 850 nm.

* * * * *